(12) United States Patent
Shyu et al.

(10) Patent No.: US 7,911,318 B2
(45) Date of Patent: Mar. 22, 2011

(54) CIRCUIT BOARDS WITH EMBEDDED RESISTORS

(75) Inventors: Chin-Sun Shyu, Pingtung County (TW); Chang-Sheng Chen, Taipei (TW); Chang-Lin Wei, Hsinchu (TW); Wei-Ting Chen, Tainan County (TW)

(73) Assignee: Industrial Technology Research Institute, Hsinchu (TW)

( * ) Notice: Subject to any disclaimer, the term of this patent is extended or adjusted under 35 U.S.C. 154(b) by 958 days.

(21) Appl. No.: 11/707,539

(22) Filed: Feb. 16, 2007

(65) Prior Publication Data

US 2008/0197967 A1 Aug. 21, 2008

(51) Int. Cl.
*H01C 1/012* (2006.01)
(52) U.S. Cl. ......... 338/312; 338/195; 338/309; 338/314
(58) Field of Classification Search .............. 338/309, 338/195, 312, 314
See application file for complete search history.

(56) References Cited

U.S. PATENT DOCUMENTS

| | | | | |
|---|---|---|---|---|
| 3,409,856 | A | * | 11/1968 | Meoni ............................ 338/312 |
| 4,443,782 | A | | 4/1984 | Poirier D'Ange D'Orsay |
| 4,792,779 | A | * | 12/1988 | Pond et al. .................... 338/195 |
| 4,899,126 | A | | 2/1990 | Yamada |
| 5,831,510 | A | * | 11/1998 | Zhang et al. ................. 338/22 R |
| 5,852,397 | A | * | 12/1998 | Chan et al. .................. 338/22 R |
| 7,277,005 | B2 | * | 10/2007 | Kang et al. .................... 338/309 |
| 7,334,318 | B2 | * | 2/2008 | Hashimoto et al. ............. 29/619 |
| 2006/0176145 | A1 | * | 8/2006 | Min et al. ....................... 338/309 |

OTHER PUBLICATIONS

Office Action issued Sep. 16, 2010 of corresponding Taiwanese Application No. 096115775.

* cited by examiner

*Primary Examiner* — Anh T Mai
*Assistant Examiner* — Joselito Baisa
(74) *Attorney, Agent, or Firm* — Alston & Bird LLP

(57) ABSTRACT

The present invention relates to an adjustable resistor embedded in a circuit board and a method of fabricating the same. The adjustable resistor comprises a resistor with a number of connection terminals, and a number of via holes extending to contact with the resistor. The resistive value of the resistor is variable depending on the size of the via holes, the number of the via holes, or the distance between the via holes.

28 Claims, 13 Drawing Sheets

CIRCUIT BOARDS WITH EMBEDDED RESISTORS

BACKGROUND OF THE INVENTION

1. Field of the Invention

This invention generally relates to circuit boards, and more particularly, to a circuit board with embedded resistors and a method of fabricating the same.

2. Background of the Invention

The market for communication devices is growing at an amazing pace. Nowadays, the basic requirements for communication devices are small, thin and lightweight. With increasingly stricter communication standards, packing circuit components in a small device while retaining its efficiency becomes a major issue for circuit design. In recent years, system-in-package technology is developed to pack circuit components in multilayer printed circuit boards with a high density to meet market demand. Integration of passive discrete components, such as resistors, capacitors and inductors, into printed circuit boards may miniaturize the system packages as well as reduce assembly time and manufacturing cost.

One major concern for embedded resistor technology is control of resistance values because it may affect the yield of manufacturing process. Indeed, resistance values depend on the thickness of resistors after board lamination process, and thus, it is desirable to improve board lamination process for better control of resistance value. In addition, it is also desirable to develop a method to adjust resistance values of embedded resistors after completion of the lamination process to meet various needs.

U.S. Pat. No. 4,443,782 describes a method for regulating the resistance value of a thick film resistor by adjusting the length of a slot located in the resistive material region. Variation of the resistance value is a linear function of the slot length. A slot may be formed by use of a grinding machine or a laser beam. U.S. Pat. No. 4,899,126 describes thick film resistor type printed circuit board having a common terminal electrode for connecting multiple resistors. The patent also mentions using laser beam to form slots to adjust resistance value. Both methods described above are for surface-mounted resistors and do not apply to embedded resistors.

BRIEF SUMMARY OF THE INVENTION

One example consistent with the invention provides a printed circuit board comprises a dielectric substrate, a resistive layer formed on first portions of the dielectric substrate, a wiring layer formed on second portion of the dielectric substrate for providing electrical connection, and a via hole formed in a thickness direction of dielectric substrate and extending to contact with the resistive layer. The resistance value of the resistive layer is variable depending on the size of the via hole.

Another example consistent with the invention provides a printed circuit board which comprises a dielectric substrate, a resistive layer formed on first portions of the dielectric substrate, a wiring layer formed on second portions of the dielectric substrate for providing electrical connection, a number of via holes formed in a thickness direction of dielectric substrate and extending to contact with the resistive layer. The resistance value of the resistive layer is variable depending on the size of the via holes, the number of the via holes, or the distance between the via holes.

Another example consistent with the invention provides an adjustable resistor embedded in a circuit board comprises a resistor with a number of connection terminals, and a via hole extending to contact with the resistor. The resistive value of the resistor is variable depending on the size of the via hole.

In another example consistent with the invention, an adjustable resistor embedded in a circuit board comprises a resistor with a number of connection terminals, and a number of via holes extending to contact with the resistor. The resistive value of the resistor is variable depending on the size of the via holes, the number of the via holes, or the distance between the via holes.

In another example consistent with the invention, a method of fabricating a printed circuit board comprises providing a dielectric layer, forming a wiring layer, forming a resistive layer, and forming a via hole extending through the dielectric layer and extending to contact with the resistive layer.

It is to be understood that both the foregoing general description and the following detailed description are exemplary only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended, exemplary drawings. It should be understood, however, that the invention is not limited to the precise arrangements and instrumentalities shown.

In the drawings.

DETAILED DESCRIPTION OF THE INVENTION

Figure 1A:
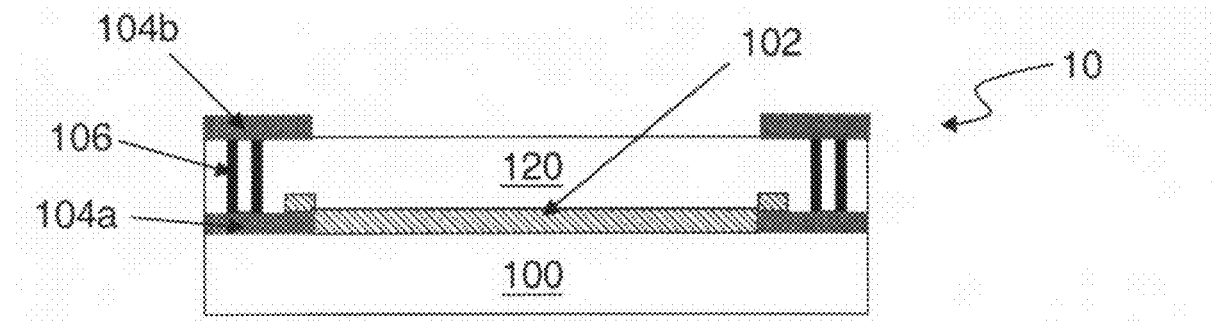
FIG. 1A is a cross-sectional view of a conventional printed circuit board with an embedded resistor.
Figure 1B:
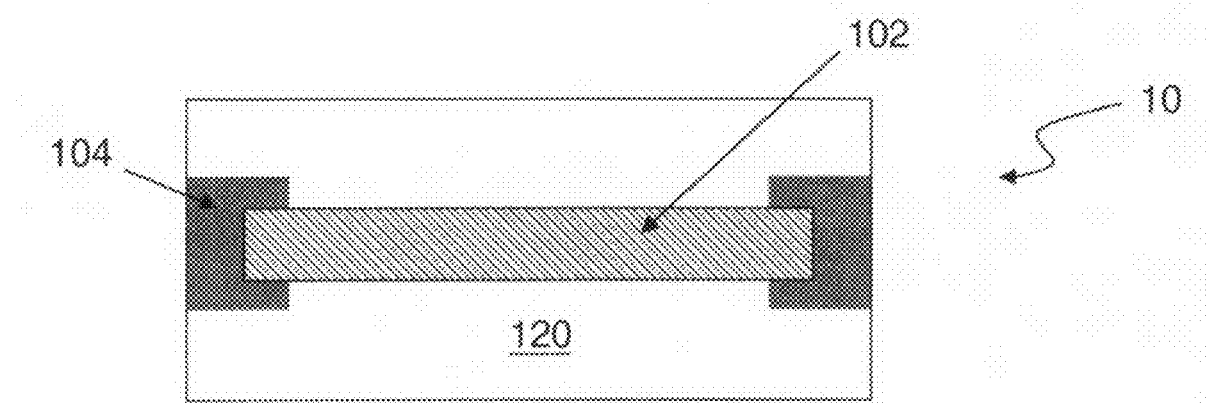
FIG. 1B is a top view of a conventional printed circuit board with an embedded resistor.

FIG. 1A illustrates an exemplary structure of a conventional circuit board 10 with an embedded resistor. Referring to FIG. 1A, the circuit board 10 may include dielectric substrate 100, a resistive layer 102, wiring layers 104a and 104b, and copper-plated via holes 106 connecting wire layers 104. The fabrication process may start with providing a layer of a polymeric dielectric material to form the dielectric substrate 100 having a top and bottom surfaces. The dielectric substrate 100 may be made of as polyimide, BT resin polymer, glass fiber, or high dielectric constant (DK) material with DK ranging from 15-80. For example, the dielectric substrate 100 may be an aluminum oxide substrate, a low-temperature cofired ceramic substrate or a ceramic substrate. The dielectric substrate 100 typically has a thickness or dimension between its top and bottom surfaces of 150 um or less. Next, the process continues with providing a conductive material such as copper on the top surface of the dielectric substrate 100 and patterning it to form the wiring layer 104a. Thereafter, a resistive material is provide on the exposed dielectric substrate 100 and the wiring layer 104a and then is patterned to form the resistive layer 102. The resistive material may be provided as a paste that includes a highly conductive material such as a metal powder, metal oxides, graphite or other form of carbon or semiconductor materials in a nonconductive matrix such as a polymer. Another dielectric layer 120 as the substrate 100 is subsequently formed on the exposed wiring layer 104a and the resistive layer 102. Next, another wiring layer 104b is formed on the dielectric layer 120. Via holes 106 are subsequently formed in the thickness direction of the substrate 100 and extend through the dielectric layer 120. The via holes 106 may be form by, for example, laser ablation, plasma etching, punching and drilling. The via holes 106 are then filled with, plated with, or coated with a conductive paste to form conductors. In one example, via holes 106 are coated with copper. With copper-plated via holes 106, the wiring layers 104a and 104b are electrically connected to each other. FIG. 1B shows the top view of FIG. 1A.

Figure 1C:
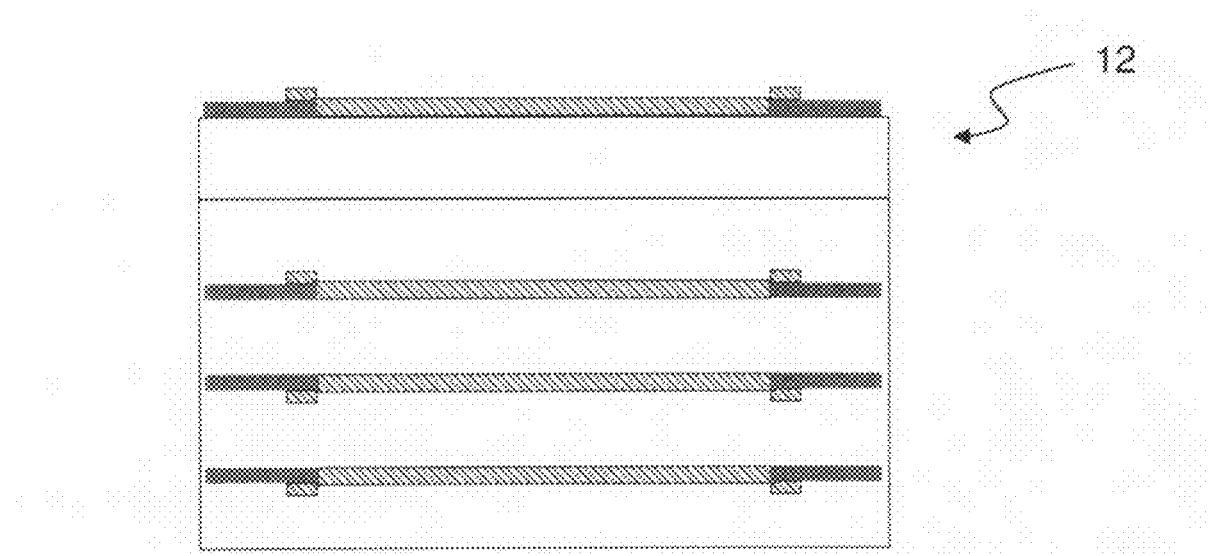
FIG. 1C is a cross-sectional view of a conventional multilayer printed circuit board.

FIG. 1C illustrates an exemplary structure of a conventional multilayer circuit board 12 with a number of embedded resistors. The multilayer circuit board 12 of FIG. 1C comprises a laminate of at least two printed circuit boards of FIG. 1A. As shown at FIG. 1C, resistors may be embedded between any two adjacent layers of the dielectric substrates.

Figure 2A:
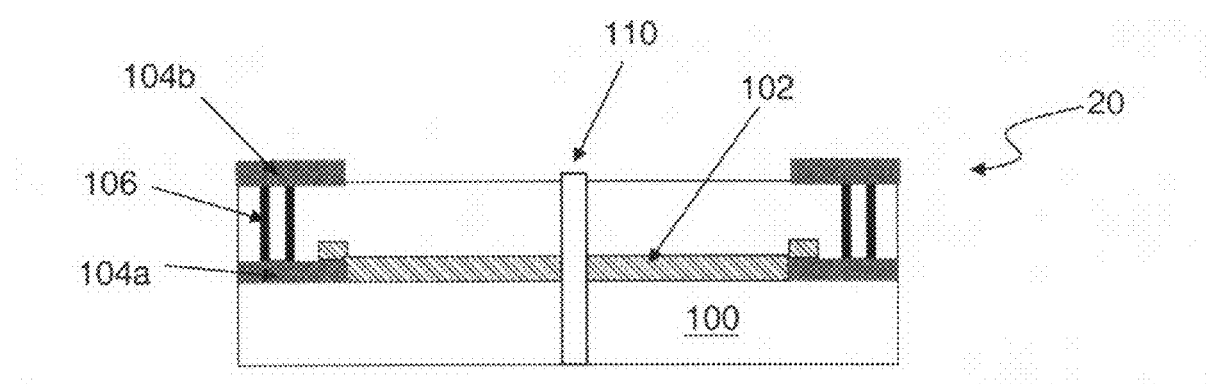
FIG. 2A is a cross-sectional view of a printed circuit board with an embedded resistor in examples consistent with the present invention.
Figure 2B:
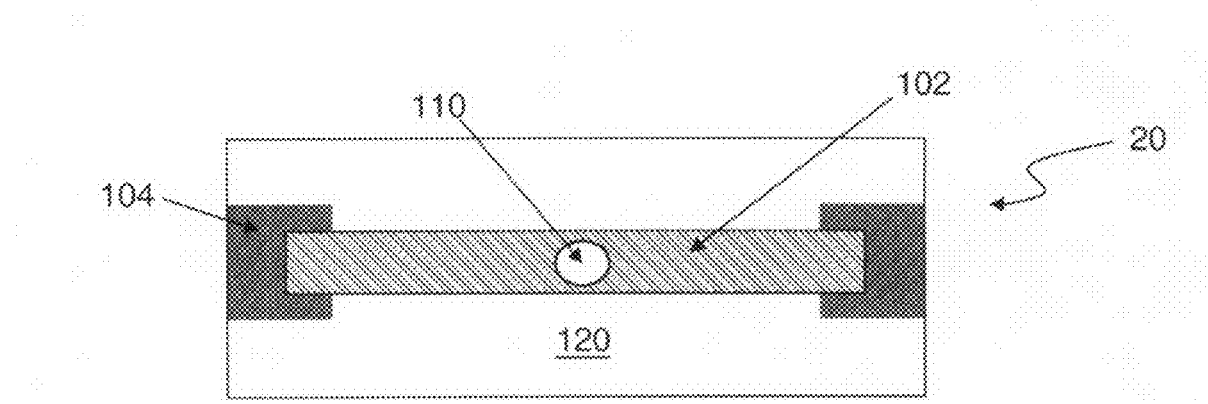
FIG. 2B is a top view of a printed circuit board with an embedded resistor in examples consistent with the present invention.
Figure 2C:
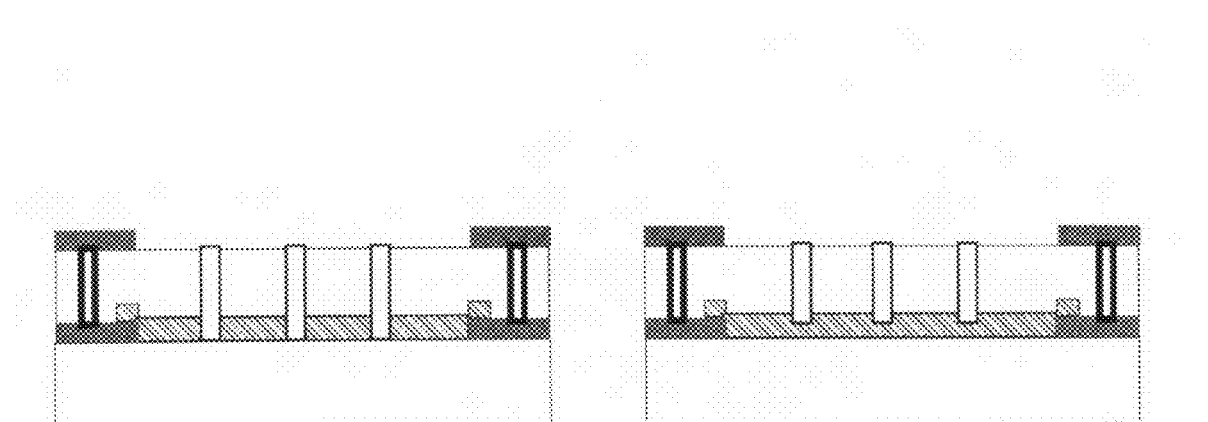
FIGS. 2C(a) and (b) are cross-sectional views of a printed circuit board with an embedded resistor in examples consistent with the present invention.
Figure 2D:
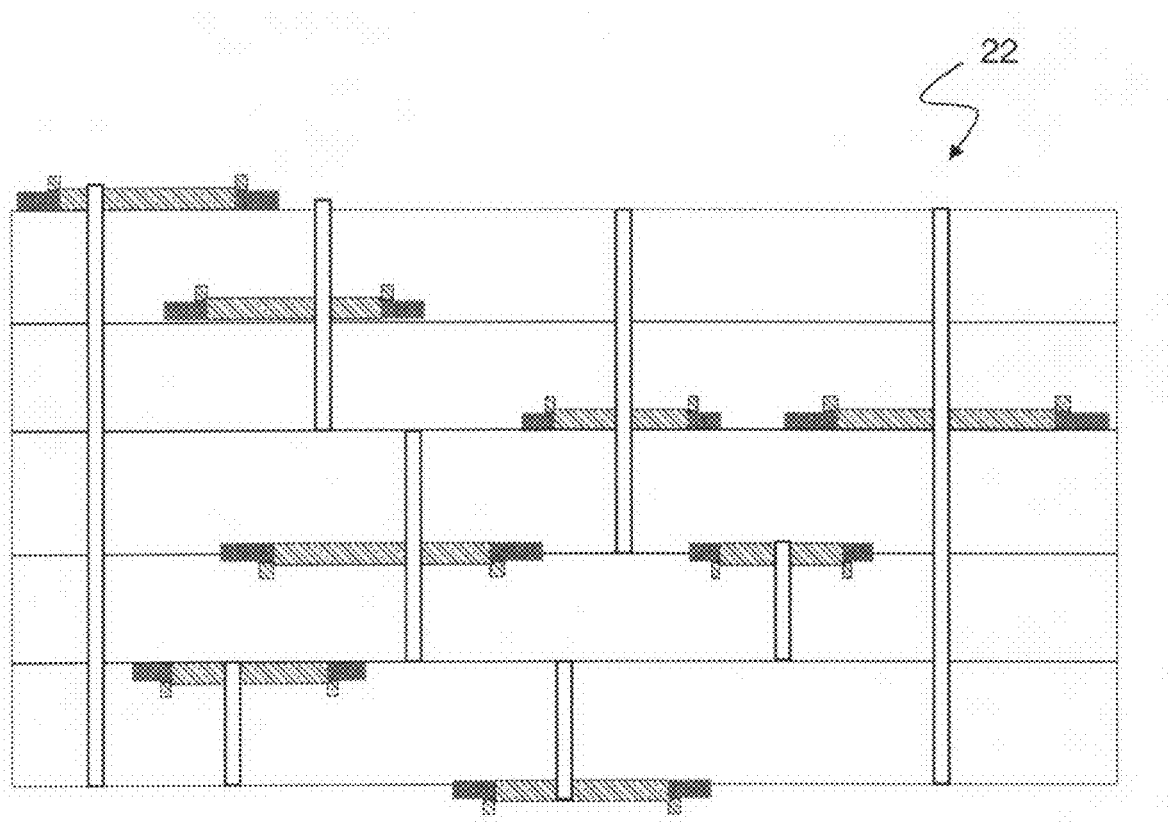
FIG. 2D is a cross-sectional view of a multilayer printed circuit board with embedded resistors in examples consistent with the present invention.

FIG. 2A illustrates an exemplary structure of a printed circuit board 20 in examples consistent with the present invention. FIG. 2B shows the top view of FIG. 2A. The printed circuit board 20 includes a dielectric substrate 100, a resistive layer 102, wiring layers 104a and 104b and via holes 106 as described in connection with FIG. 1A. In addition, the printed circuit board 20 includes an additional via hole 110 formed in the thickness direction of the dielectric substrate 100. The via hole 110 may be formed by, for example, laser ablation, plasma etching, punching and drilling. FIGS. 2C(a) and (b) show that the via holes may pouch through both the dielectric layer 120 and the resistor layer 102 or extend through the dielectric layer 120 to contact the resistor layer 102 without pouching through the resistor layer 102. FIG. 2D illustrates an exemplary structure of a multilayer circuit board 22 with a number of embedded resistors and via holes.

Figure 2E:
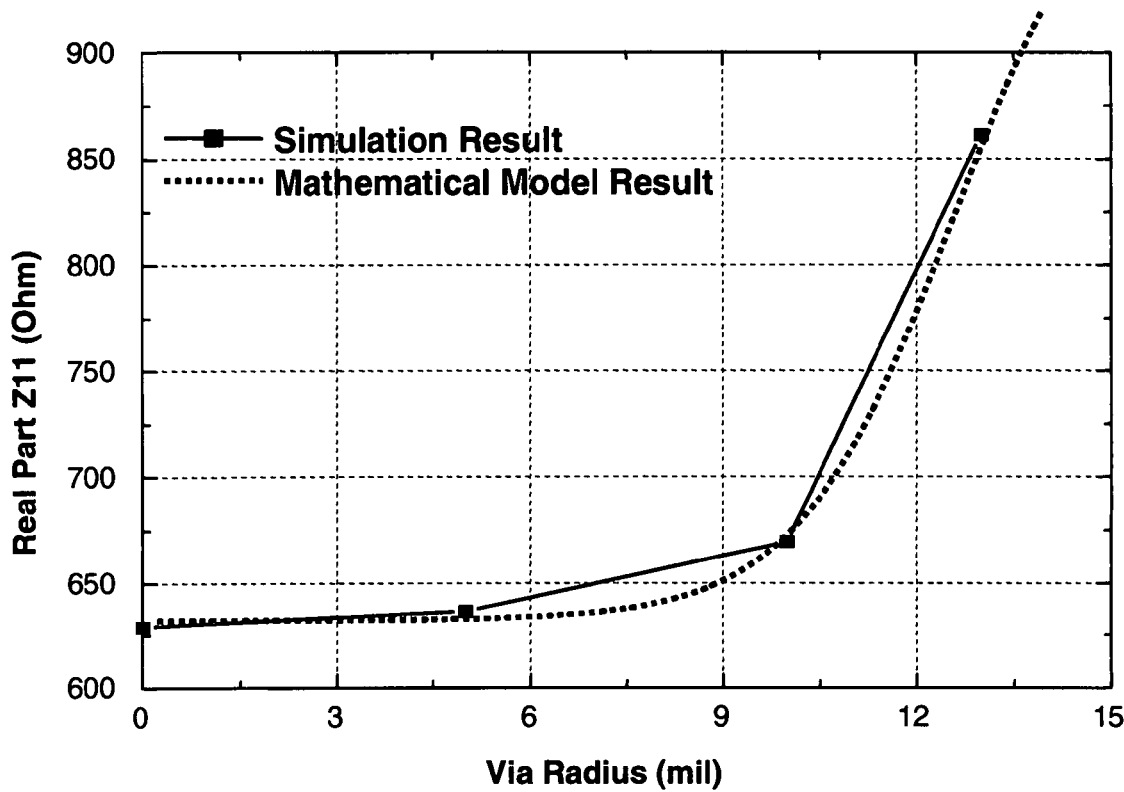
FIG. 2E shows the experimental results in an exemplary implementation.

FIG. 2E shows the experimental results in an exemplary implementation. In the experiment, the area size of the resistor is 90*30 mil², the thickness of the resistor is 0.8 mil, and $$\rho = 160\left(\frac{\text{siemens}}{\text{m}}\right).$$

The results indicate that the resistance value of the finished resistor depends on the area size of the via hole. Table 1 below shows the experimental results on the resistance value of a printed circuit board of FIG. 2A with only one via hole contacting the resistive layer.

TABLE 1

| @ 10 MHz | Original resistor | 5 mil via hole | 10 mil via hole | 13 mil via hole |
|---|---|---|---|---|
| Resistance (Ohm) | 628.87 | 636.48 | 669.36 | 860.87 |
| Resistance change (%) | — | 1.21 | 6.43 | 36.89 |

Figure 2F:
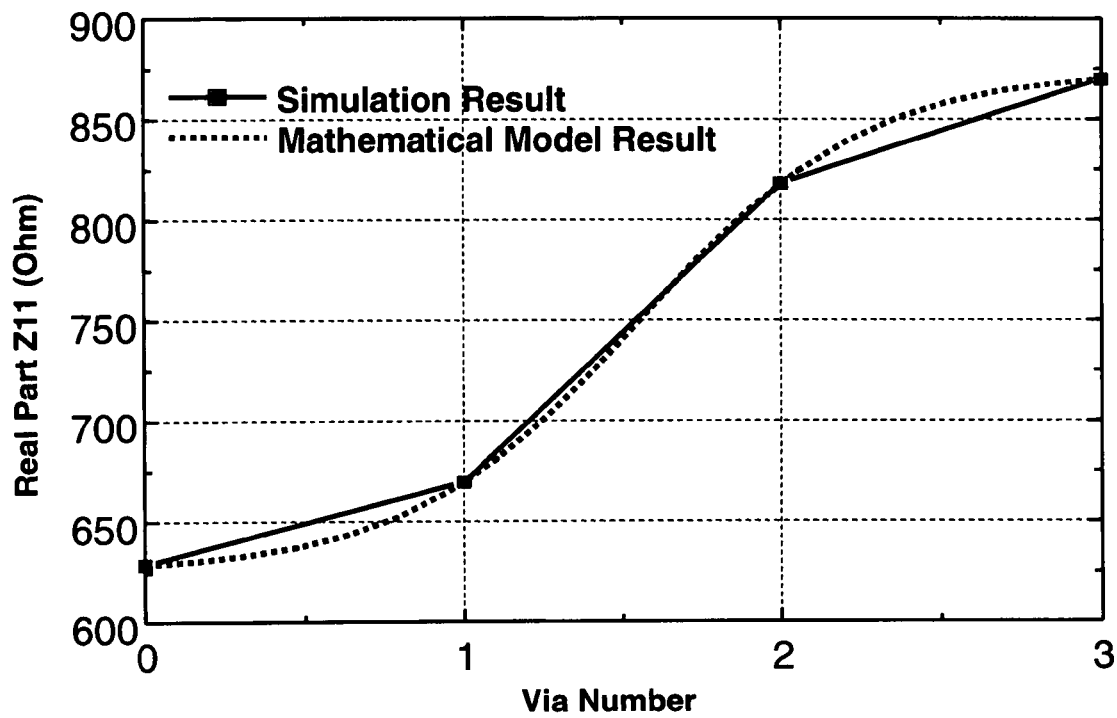
FIG. 2F shows the experimental results in an exemplary implementation.

FIG. 2F shows experimental results in another exemplary implementation where the printed circuit board has more than one via holes. The results indicate that the resistance value of the printed circuit board increases when the number of the via holes increases. Table 2 below shows the experimental results.

TABLE 2

| @ 10 MHz | Original resistor | One via hole | Two via holes | Three via holes |
|---|---|---|---|---|
| Resistance (Ohm) | 628.87 | 669.36 | 818.15 | 869.59 |
| Resistance change (%) | — | 6.43 | 30.09 | 38.27 |

Figure 3A:
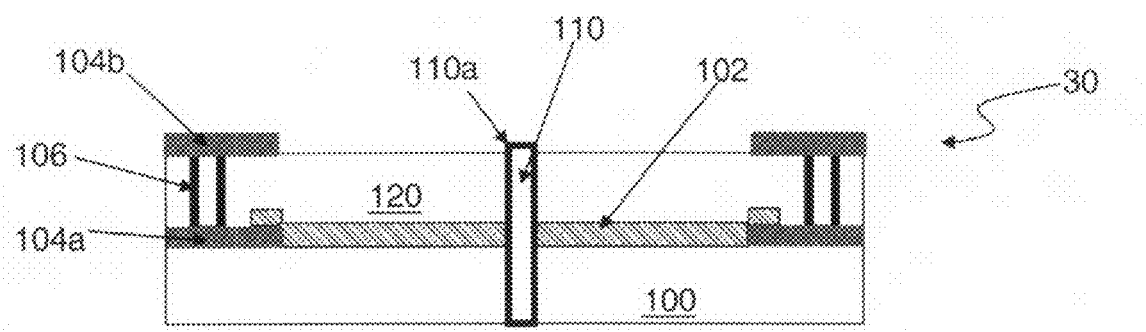
FIG. 3A is a cross-sectional view of a printed circuit board with an embedded resistor in examples consistent with the present invention.
Figure 3B:
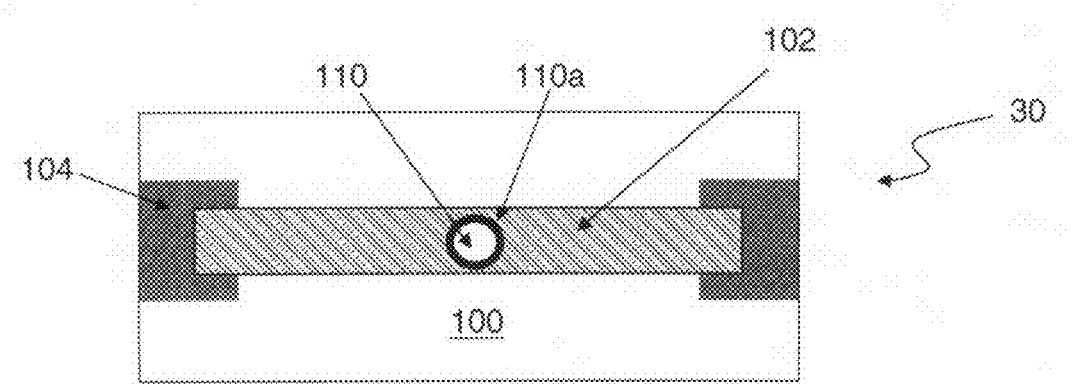
FIG. 3B is a top view of a printed circuit board with an embedded resistor in examples consistent with the present invention.
Figure 3C:
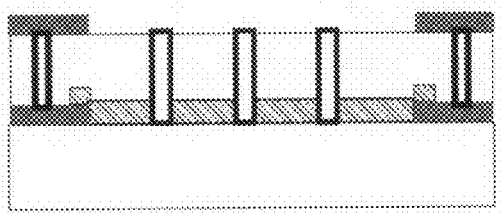
FIGS. 3C(a) and (b) are cross-sectional views of a printed circuit board with an embedded resistor in examples consistent with the present invention.
Figure 3C:
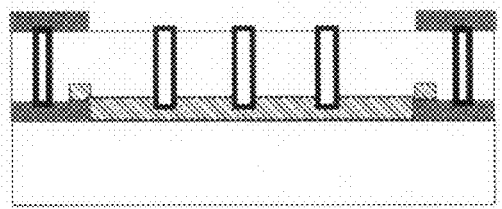
Figure 3D:
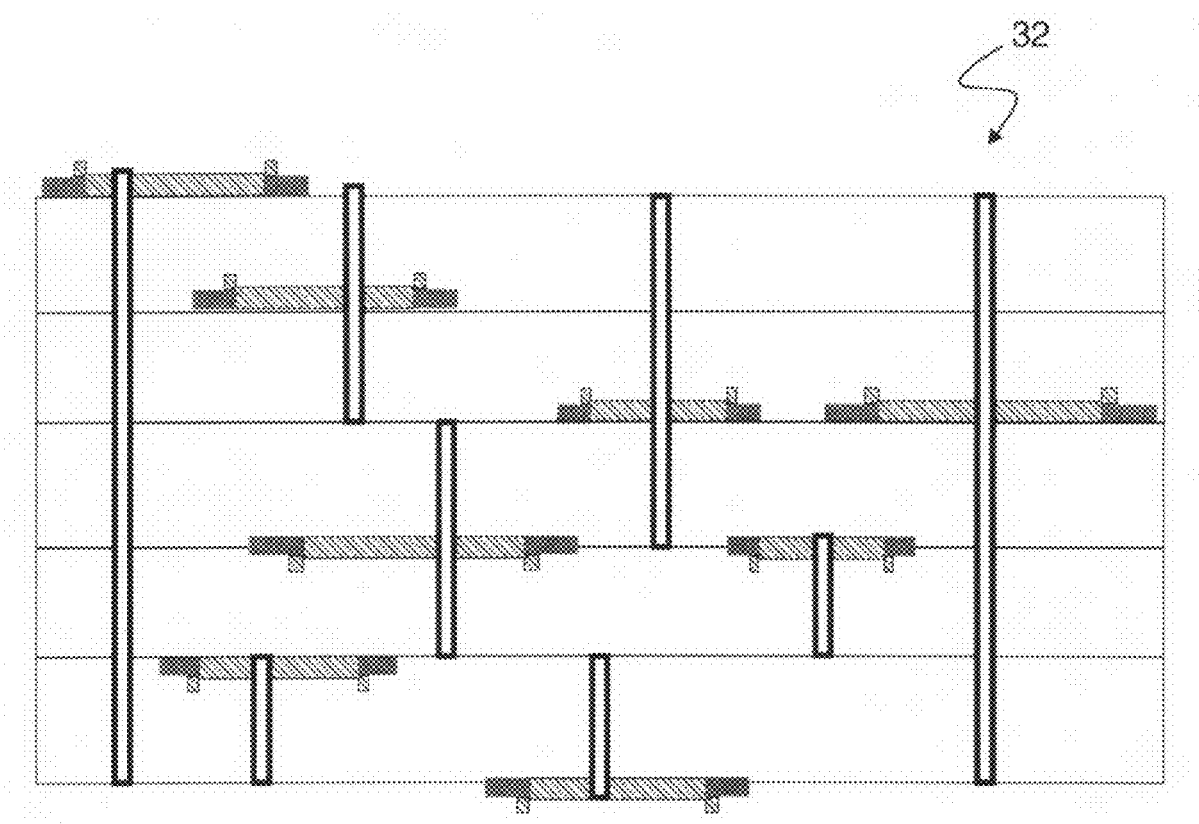
FIG. 3D is a cross-sectional view of a multilayer printed circuit board with embedded resistors in examples consistent with the present invention.

FIG. 3A illustrates an exemplary structure of a printed circuit board 30 in examples consistent to the present invention. FIG. 3B shows the top view of FIG. 3A. The structure of FIG. 3A is similar to the structure of FIG. 2A, except that the via hole 110 is either filled, coated or plated with conductive materials 110a. In one example, the via hole 110 is coated with copper. FIGS. 3C(a) and (b) show that via holes 110 plated with conductive metal may either pouch through the resistive layer 102 or make contact with the resistor layer 102 without pouching through the resistive layer 102. FIG. 3D illustrates an exemplary structure of a multilayer circuit board 32 with a number of embedded resistors and via holes plated with conductive materials.

Figure 3E:
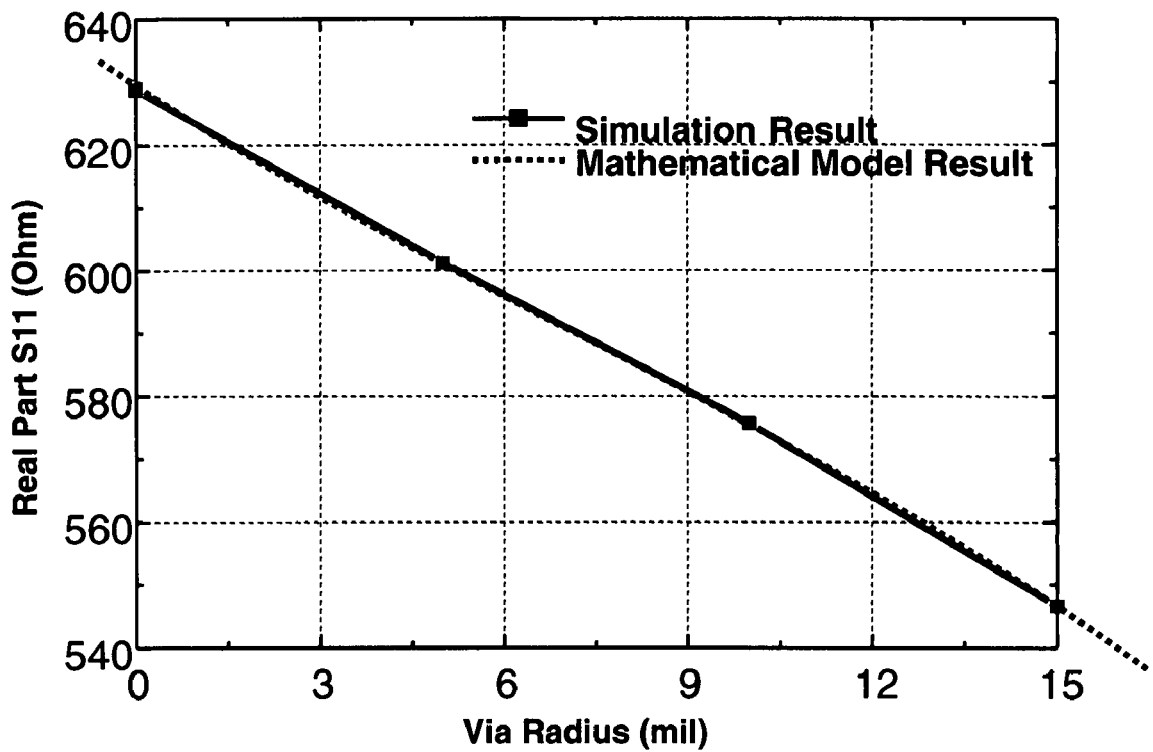
FIG. 3E shows the experimental results in an exemplary implementation.

FIG. 3E shows experimental results in an exemplary implementation where the via hole is plated with copper. The results indicate that the resistance value decreases in accordance with the increase of via radius. Table 3 below shows the experimental results.

TABLE 3

| @ 10 MHz | Original resistor | 5 mil via hole | 10 mil via hole | 15 mil via hole |
|---|---|---|---|---|
| Resistance (Ohm) | 628.87 | 601.18 | 575.69 | 575.69 |
| Resistance change (%) | — | −4.4 | −8.45 | −13.08 |

Figure 3F:
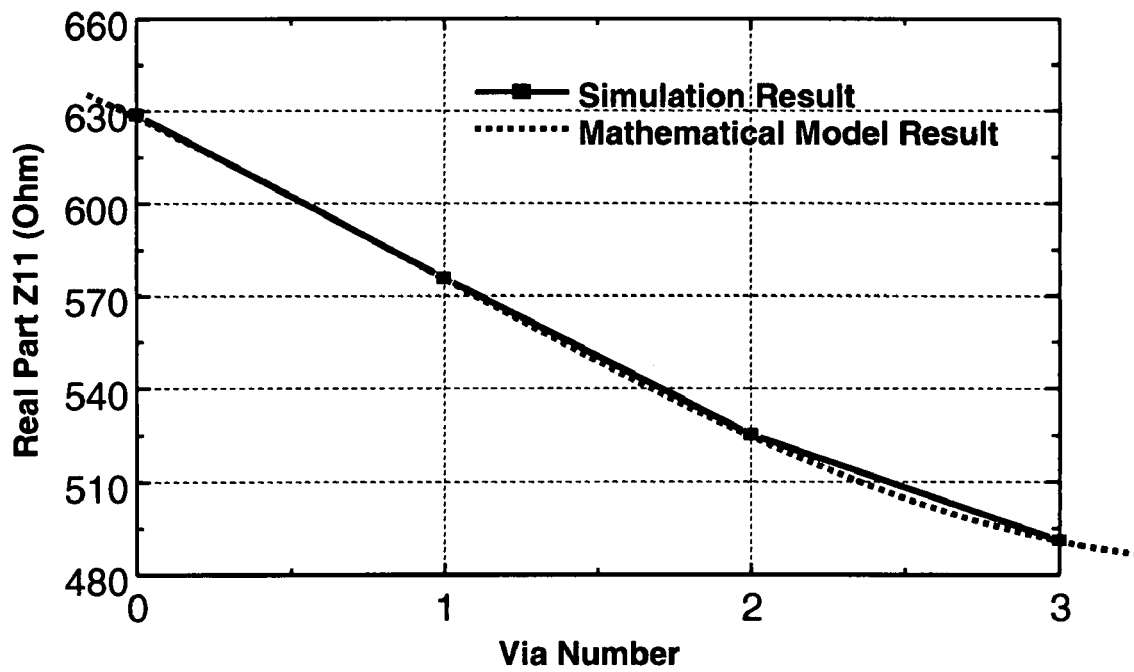
FIG. 3F shows the experimental results in an exemplary implementation.

FIG. 3F shows experimental results in another exemplary implementation where the printed circuit board has more than one via holes and each via hole is plated with copper. The results indicate that the resistance value of the printed circuit board decreases when the number of the via holes increases. Table 4 below shows the experimental results.

TABLE 4

| @ 10 MHz | Original resistor | One via hole | Two via holes | Three via holes |
|---|---|---|---|---|
| Resistance (Ohm) | 628.87 | 575.69 | 525.27 | 491.09 |
| Resistance change (%) | — | −8.45 | −16.47 | −21.90 |

Figure 4A:
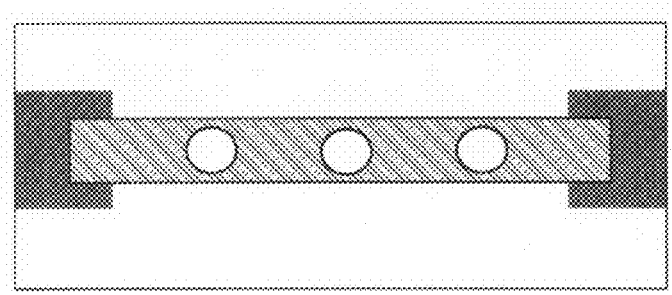
FIGS. 4A-4B are top views of exemplary printed circuit boards in examples consistent with the present invention.
Figure 4B:
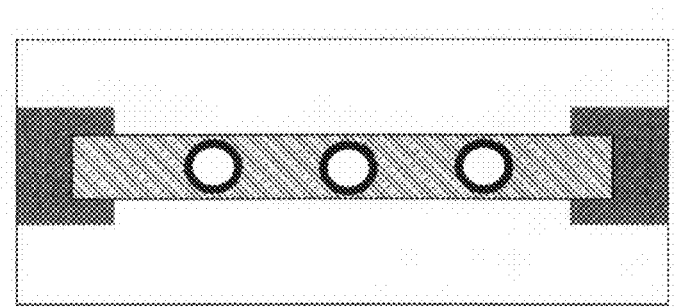

Referring again to FIGS. 2C and 3C, the exemplary printed circuit board in consistent with the present invention may include more than one via holes 110. FIGS. 2C(a) and (b) illustrate an exemplary structure of a printed circuit board with multiple via holes in examples consistent with the present invention. FIG. 4(a) shows the top view of the printed circuit board of FIGS. 2C(a) or (b). FIGS. 3C(a) and (b) illustrate an exemplary structure of a printed circuit board with multiple via holes plated with conductive materials in examples consistent with the present invention. FIG. 4(b) shows the top view of the printed circuit board of FIGS. 3C(a) or (b).

Figure 5A:
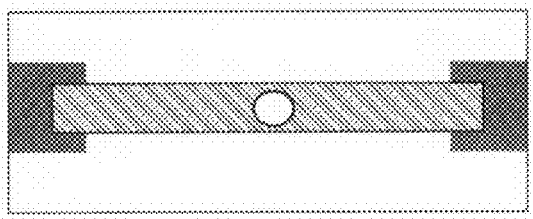
FIGS. 5A-5D are top views of exemplary printed circuit boards in examples consistent with the present invention.
Figure 5B:
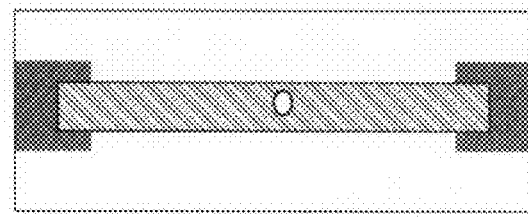
Figure 5C:
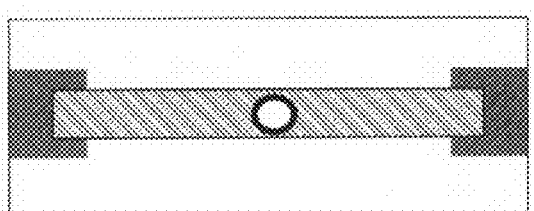
Figure 5D:
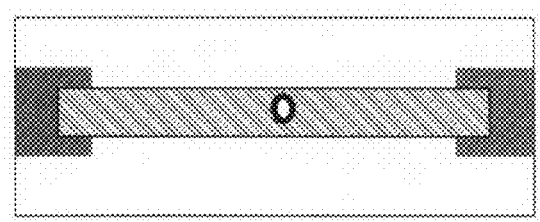
Figure 6A:
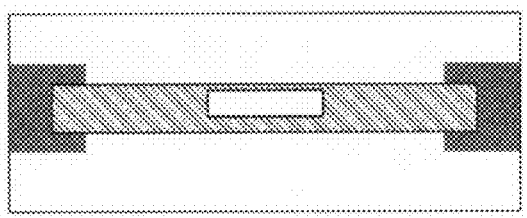
FIGS. 6A-6H are top views of exemplary printed circuit boards in examples consistent with the present invention.
Figure 6B:
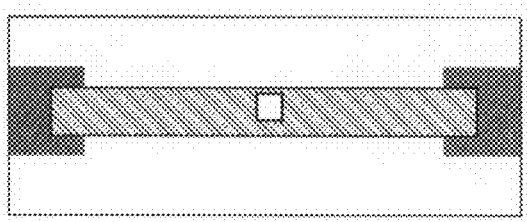
Figure 6C:
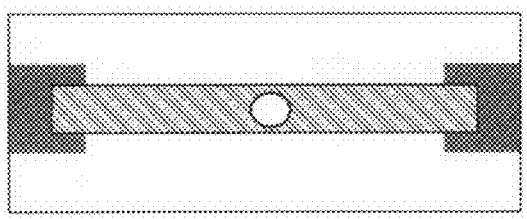
Figure 6D:
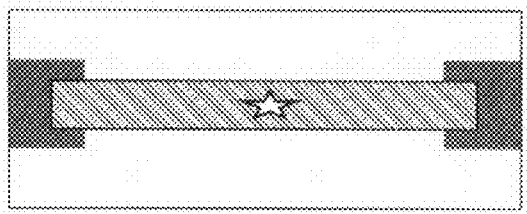
Figure 6E:
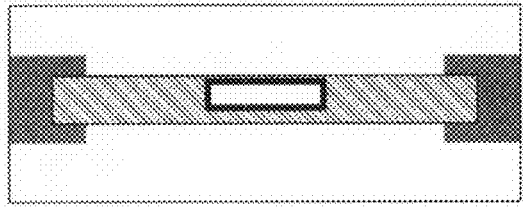
Figure 6F:
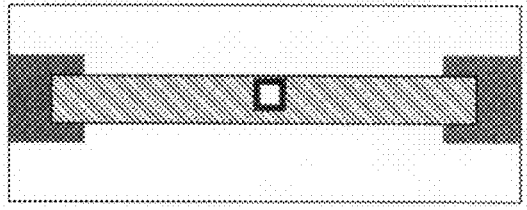
Figure 6G:
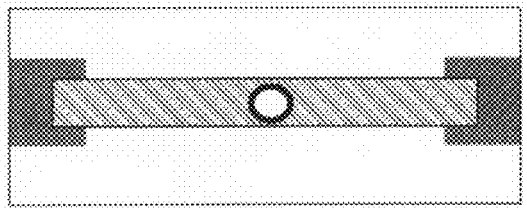
Figure 6H:
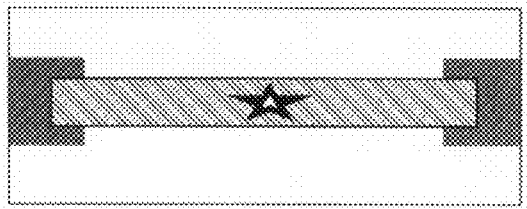

FIGS. 5A-5D show the top views of exemplary printed circuit boards in examples consistent with the present invention. FIGS. 5A and 5B illustrate that the via holes of the exemplary printed circuit boards may be in different sizes. FIGS. 5C and 5D illustrate that the via holes plated with conductive materials of the exemplary printed circuit boards may be in different sizes.

FIGS. 6A-6H show the top views of exemplary printed circuit boards in examples consistent with the present invention. FIGS. 6A-6D illustrate that the via holes of the exemplary printed circuit boards may have via holes in various shapes. FIGS. 6E-6H illustrate that the via holes plated with conductive materials of the exemplary printed circuit boards may be in various shapes.

Figure 7A:
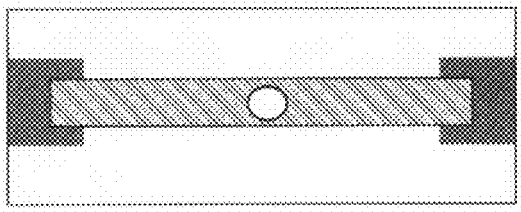
FIGS. 7A-7D are top views of exemplary printed circuit boards in examples consistent with the present invention.
Figure 7B:
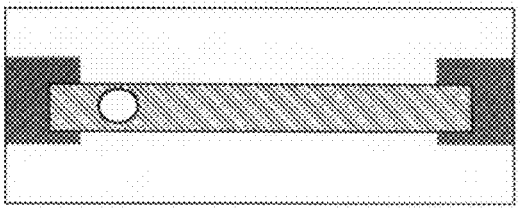
Figure 7C:
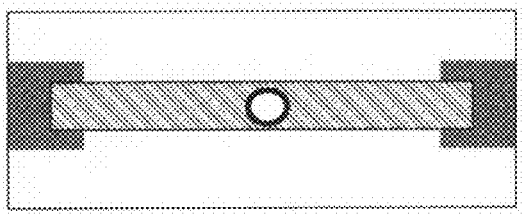
Figure 7D:
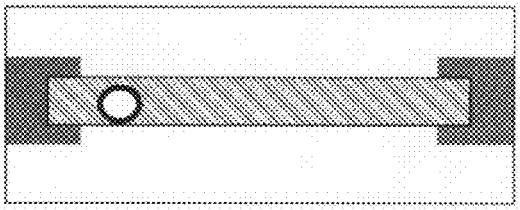
Figure 8A:
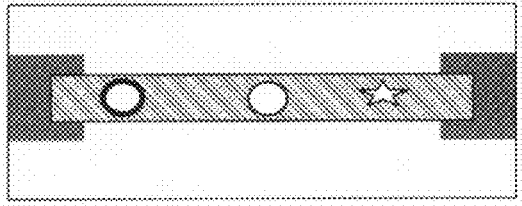
FIGS. 8A-8D are top views of exemplary printed circuit boards in examples consistent with the present invention.
Figure 8B:
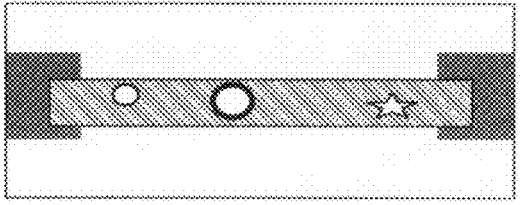
Figure 8C:
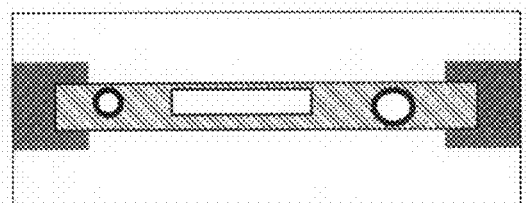
Figure 8D:
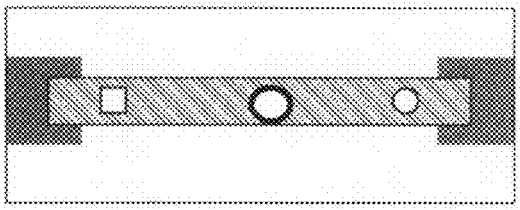

FIGS. 7A-7D show the top views of exemplary printed circuit boards in examples consistent with the present invention. FIGS. 7A and 7B illustrate that the via holes of the exemplary printed circuit boards may be formed in various locations of the resistive layers. FIGS. 7C and 7D illustrate that the via holes plated with conductive materials of the exemplary printed circuit boards may be formed in various locations of the resistive layers.

FIGS. 8A-8D show the top views of exemplary printed circuit boards in examples consistent with the present invention. FIGS. 8A-8D illustrate that the via holes in an exemplary printed circuit board may be in different size or shape, or in various locations of the resistive layer. In addition, referring to FIGS. 8A-8D, the via holes in an exemplary printed circuit board are in combination of metal plated via holes and via holes without metal plated.

The present invention also provides a multilayer printed circuit board with adjustable embedded resistors where the resistance value is adjusted by reducing the length of the resistors. According to Equation (1) below, the length of a resistor is linear function of the resistance value of the resistor. Therefore, the resistance value can be precisely adjusted by reducing the length of the resistor.

$$R = \rho \frac{L}{A}$$ Eq. (1)

$\rho$: Resisitivity  $L$: Resistor length  $A$: resistor section area

Figure 9A:
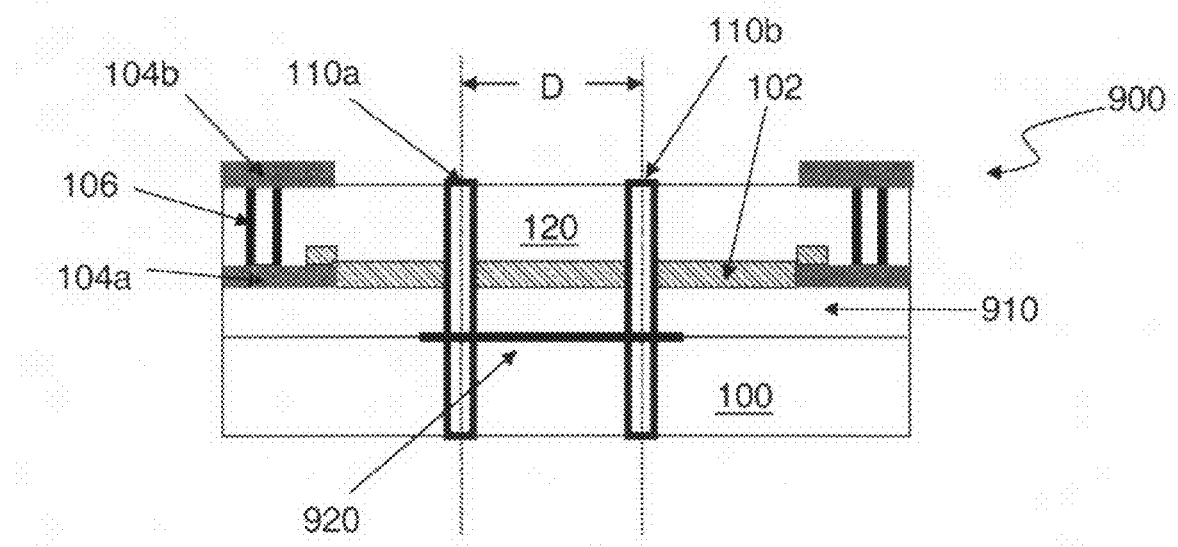
FIG. 9A is a cross-sectional view of a printed circuit board with an embedded resistor in examples consistent with the present invention.
Figure 9B:
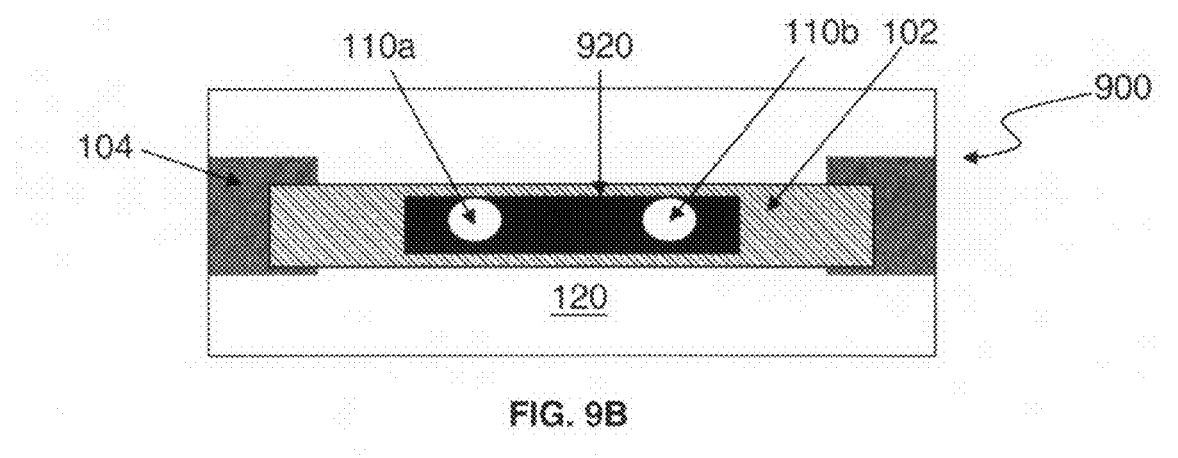
FIG. 9B is a top view of a printed circuit board with an embedded resistor in examples consistent with the present invention.

FIG. 9A illustrates an exemplary structure of a printed circuit board 900 in examples consistent with the present invention. Referring to FIG. 9A, the printed circuit board 900 may include dielectric substrates 100 and 120, a resistive layer 102, wiring layers 104a and 104b, and copper-plated via holes 106, 110a and 110b to connect wire layers 104 as described in FIG. 2A. The via holes 110a and 110b may be either filled, coated or plated with conductive materials such as copper as described in connection with FIG. 3A. In addition, the printed circuit board 40 of FIG. 9A also includes a dielectric layer 910 between the resistive layer 102 and the dielectric substrate 100. The dielectric layer 910 may be a material selected from polyimide, BT resin polymer, glass fiber, and high dielectric constant (DK) material with DK ranging from 15-80. On the bottom surface of the dielectric layer 910, there is a supplement metal layer 920. The supplement metal layer 920 may be made of any conductive materials, such as copper. As discussed below, variation of the resistance value of the resistor layer 102 depends on the distance D between the two copper-plated via holes 110a and 110b. FIG. 9B shows the top view of FIG. 9A.

Figure 9C:
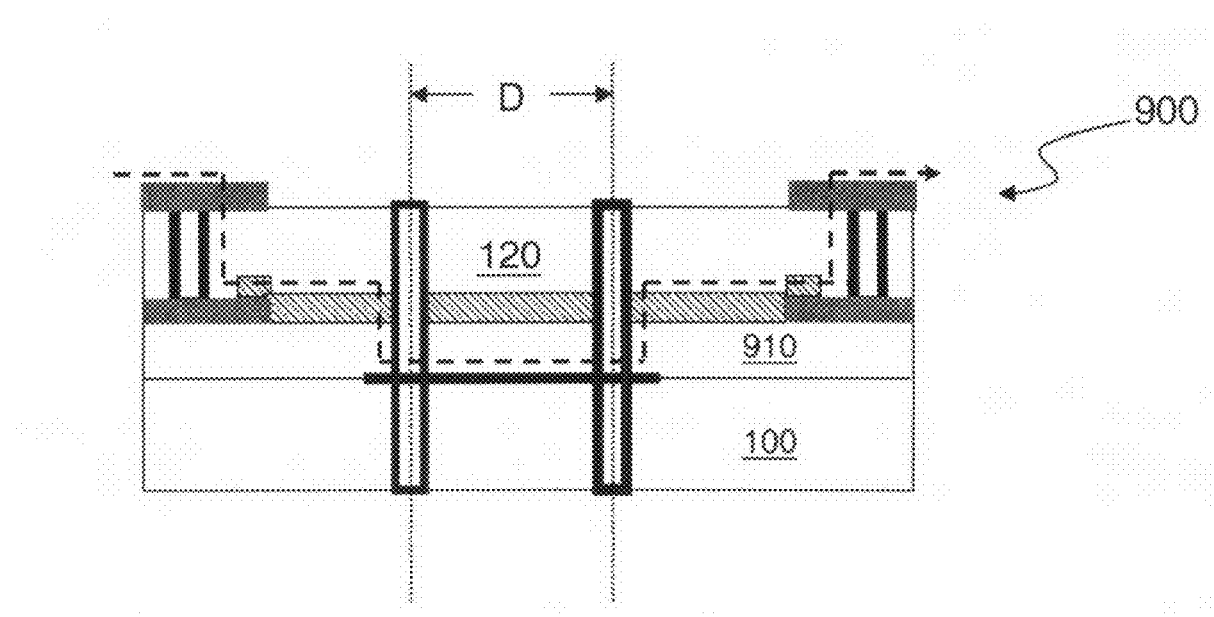
FIG. 9C is a cross-sectional view of a printed circuit board with an embedded resistor in examples consistent with the present invention.
Figure 9D:
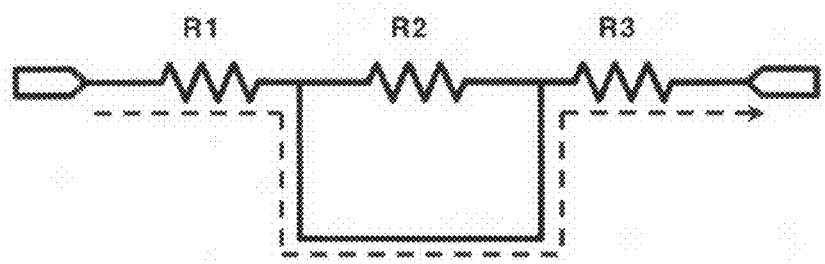
FIG. 9D is a simplified electrical circuit equivalent for the resistor in FIG. 9C.

FIG. 9C illustrates the DC signal path for the printed circuit board 900 of FIG. 9A. The DC signal first passes through portions of the resistive layer 102, then flows through the supplement metal layer 920 due to the low resistance value of the metal layer 920. Then the DC signal flows through another portions of the resistive layer 102 as indicated. FIG. 9D is a simplified electrical equivalent circuit for the resistor of the printed circuit board 900 of FIG. 9C. Assuming that the original resistance value of the resistance layer 102 is $R_1+R_2+R_3$, the resistance value decreases to $R_1+R_3$ because of the supplement metal layer 920.

Figure 9E:
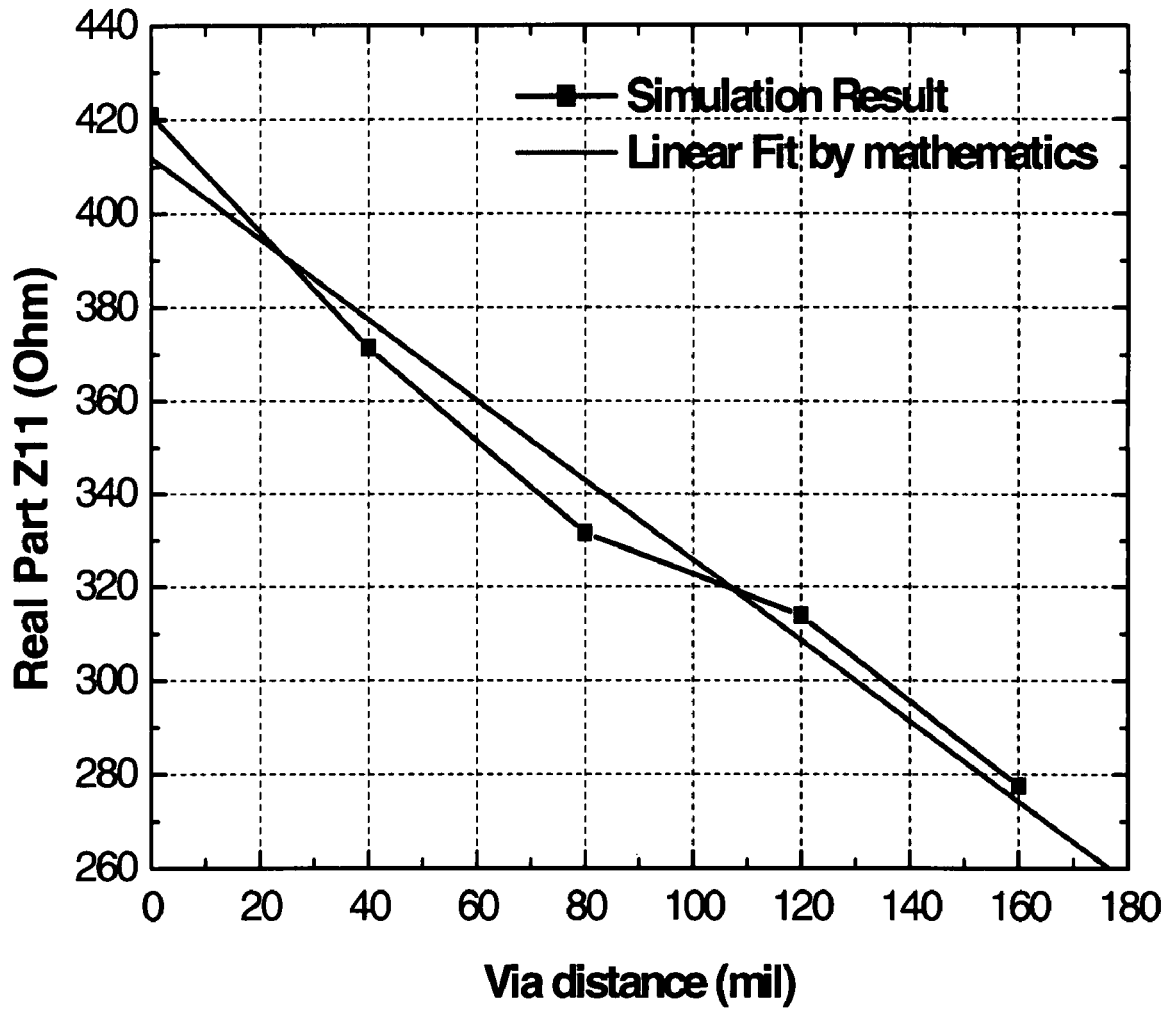
FIG. 9E shows the experimental results in an exemplary implementation.

FIG. 9E shows experimental results in another exemplary implementation where the distance between two via holes 110a and 110b varies. The results indicate that the resistance value of the printed circuit board decreases when the distance between the two via holes increases. Table 5 below shows the experimental results.

TABLE 5

| @ 10 MHz | Original resistor | Distance: 40 mil | Distance: 80 mil | Distance: 120 mil | Distance: 160 mil |
|---|---|---|---|---|---|
| Resistance (Ohm) | 420.81 | 371.43 | 331.58 | 313.82 | 277.59 |
| Resistance change(%) | NA | 11.73 | 21.20 | 25.42 | 34.03 |

The via holes 110*a* and 110*b* pouching through the resistive layer to contact with the supplemental metal layer 920 may be in different sizes or shapes as discussed above in connection with FIGS. 5-8.

In addition to multilayer printed circuit boards, the present invention may apply to embedded resistor in integrated circuit load circuit. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A circuit board, comprising:
    a plurality of dielectric substrates;
    a resistive layer formed on first portions of a top surface or a bottom surface of at least one of the dielectric substrates;
    a wiring layer formed on second portions of the dielectric substrate for providing electrical connection; and
    at least one via hole formed in a thickness direction of the at least one of the dielectric substrates on which the resistive layer is formed, and extending through at least a portion of a body of the resistive layer, the via hole extending through the dielectric substrate from the top surface of the dielectric substrate to the bottom surface of the dielectric substrate, or through the dielectric substrate from the bottom surface of the dielectric substrate to the top surface of the dielectric substrate,
    wherein the resistance value of the resistive layer is variable depending on a size of the via hole,
    wherein the via hole comprises at least one of a hollow portion, an insulating material that fills the via hole, an electroplated metal material, or a metal material that fills the via hole,
    wherein the via hole is plated with conductive materials, or coated with the conductive materials, or filled with the conductive materials.

2. The circuit board of claim 1, wherein the via hole is one of a plated through hole via or a laser via.

3. The circuit board of claim 1, wherein the via hole is selected from a via hole plated with conductive materials, a via hole coated with conductive materials or a via hole filled with conductive materials.

4. The circuit board of claim 3 further comprising a supplemental metal layer underneath the resistive layer, wherein the supplemental metal layer is electrically connected to the resistive layer through the via hole.

5. The circuit board of claim 1, wherein the via hole is formed in the center of the resistive layer.

6. The circuit board of claim 1, wherein the via hole is formed near one edge of the resistive layer.

7. The circuit board of claim 1, wherein the via hole is a via hole pouching through the resistive layer or a via hole extending to contact with the resistive layer without pouching through the resistive layer.

8. The circuit board of claim 1, wherein the via hole is formed through at least two dielectric substrates from the top surface of the at least one dielectric substrate to the bottom surface of the dielectric substrate or through the at least two dielectric substrates from the bottom surface of the dielectric substrate to the top surface of the dielectric substrate.

9. The circuit board of claim 1, wherein the via hole is formed through each of the dielectric substrates, and the via hole is exposed at the top surface of the dielectric substrate or the bottom surface of the at least one dielectric substrate.

10. The circuit board of claim 1, wherein the via hole is formed through a partial dielectric substrate, and the via hole is exposed at the top surface of the at least one dielectric substrate or the bottom surface of the dielectric substrate.

11. The circuit board of claim 1, wherein the via hole is formed through a partial dielectric substrate, and the via hole is not exposed at the top surface of the dielectric substrate or the bottom surface of the dielectric substrate.

12. The circuit board of claim 1, wherein the insulating material comprises a resin.

13. The circuit board of claim 1, wherein the metal material comprises copper.

14. The circuit board of claim 1, wherein the at least one via hole comprises a plurality of via holes comprising different sizes.

15. The circuit board of claim 14, wherein the at least one via hole comprises a plurality of via holes and at least one of the plurality of via holes comprises a smaller size configured for fine adjustment of the resistance value or at least one of the plurality of via holes comprises a larger size to operate coarse adjustment of the resistance value.

16. The circuit board of claim 14, wherein the at least one via hole comprises a plurality of via holes and at least one of the plurality of via holes comprises at least one of a rectangular shape, a square shape, or a round shape.

17. The circuit board of claim 1, wherein the at least one via hole comprises a plurality of via holes comprising different shapes.

18. The circuit board of claim 1, wherein the at least one via hole comprises a plurality of via holes and at least one of the plurality of via holes is formed in a center of the resistive layer.

19. The circuit board of claim 1, wherein the at least one via hole comprises a plurality of via holes and at least one of the plurality of via holes is formed near one edge of the resistive layer.

20. A circuit board, comprising:
    a dielectric substrate;
    a resistive layer formed on first portions of a top surface or a bottom surface of the dielectric substrate;
    a wiring layer formed on second portions of the dielectric substrate for providing electrical connection;
    a supplemental metal layer underneath the resistive layer; and
    two via holes formed in a thickness direction of the dielectric substrate and extending through at least a portion of a body of the resistive layer and the supplemental metal layer, respectively, at least one of the via holes extend through the dielectric substrate from the top surface of the dielectric substrate to the bottom surface of the dielectric substrate,
    wherein the resistance value of the resistive layer is variable depending on a size of the at least one via hole,
    wherein the supplemental metal layer is electrically connected to the resistive layer through the at least one via hole,
    wherein the via hole comprises at least one of a hollow portion, an insulating material that fills the via hole, an electroplated metal material, or a metal material that fills the via hole,
    wherein the via hole is plated with conductive materials, or coated with the conductive materials, or filled with the conductive materials.

21. The circuit board of claim 20, wherein the via hole comprises a plated through hole via or a laser via.

22. The circuit board of claim 20, wherein the via hole comprises a via hole pouching through the resistive layer or a via hole extending to contact with the resistive layer without pouching through the resistive layer.

23. The circuit board of claim 20, wherein the via holes comprise different sizes.

24. The circuit board of claim 20, wherein the via holes comprise different shapes.

25. The circuit board of claim 20, wherein the via hole is formed in a center of the resistive layer.

26. The circuit board of claim 20, wherein the via hole is formed near one edge of the resistive layer.

27. The circuit board of claim 20, wherein the via hole comprises a smaller size configured for fine adjustment of the resistance value or a larger size to operate coarse adjustment of the resistance value.

28. The circuit board of claim 20, wherein the via hole comprises at least one of a rectangular shape, a square shape, or a round shape.

* * * * *